United States Patent [19]

MacLaren

[11] Patent Number: 4,931,739

[45] Date of Patent: Jun. 5, 1990

[54] METER FOR MEASURING THE ELECTRIC CHARGE OF A BODY

[76] Inventor: Arthur H. MacLaren, 5 Alabaster, Irvine, Calif. 92714

[21] Appl. No.: 306,338

[22] Filed: Feb. 3, 1989

[51] Int. Cl.⁵ .................. G01N 27/60; G01W 1/16
[52] U.S. Cl. .................................... 324/452; 324/72;
324/344; 324/348; 340/601
[58] Field of Search ............... 324/72, 72.5, 452–458,
324/344, 348; 340/601

[56] References Cited

U.S. PATENT DOCUMENTS

| 3,866,114 | 2/1975 | Johnston | 324/452 |
| 4,072,896 | 2/1978 | Bijlmer | 324/458 X |
| 4,130,798 | 12/1978 | Maclaren | 324/452 X |
| 4,321,546 | 3/1982 | Schneider, Jr. | 324/457 |

Primary Examiner—Reinhard J. Eisenzopf
Assistant Examiner—Warren S. Edmonds
Attorney, Agent, or Firm—Knobbe, Martens, Olson & Bear

[57] ABSTRACT

An apparatus for sensing the electrical potential of a positive electrostatic field which is primarily below the surface of the earth, and observing the changes in a series of each reading is accomplished by means of an instrument employing a column of mercury in a small-diametered quartz tube, which is open on its lower end with means connecting to the other end for changing the level of mercury within the tube. A conductive coating on the exterior of the tube is connected to an electrometer and the coating is arranged to be selectively grounded or ungrounded in conjunction with changing the level of the mercury column. The readings for the electrometer provide a measure of the electrostatic field.

4 Claims, 1 Drawing Sheet

METER FOR MEASURING THE ELECTRIC CHARGE OF A BODY

BACKGROUND OF THE INVENTION

This invention relates generally to the sensing of electric charge in a relative sense and indicating quantatively a change in potential for large bodies such as the earth. U.S. Pat. No. 4,130,798 by Arthur H. MacLaren discloses a meter for detecting and indicating variations in such electric charge. That patent also points out that a continuous fair weather atmospheric electric current condition exists with a vertical potential gradient from the earth to the upper atmosphere and that various properties of this electrical condition can be measured. Changes in this electrical condition are described in that patent for predicting weather conditions.

More specifically, that patent discloses a method for sensing the charge on the earth by repeated measurements sensing quantatively changes in that charge level. To practice the method, an apparatus is disclosed consisting of a vertical quartz tube filled with mercury and connected at its lower end with a reservoir which can be varied in height so as to vary the height of the mercury column in the quartz tube. An electrode on the outside surface of the quartz column is connected to an electrometer, the low terminal of which is connected to the earth. A measurement, sensing relative charge level, is made by first short circuiting the electrometer thus stabilizing the apparatus at the potential of the earth. The level of mercury is then caused to move back and forth past the position of the electrode on the mercury column with the electrometer open-circuited during the passage of the mercury in one direction. When open-circuited, the electrometer provides a potential indication which is a direct measure of the charge induced on the electrode on the tube. A plurality of such measurements provide a quantitative indication of the change in the level of the charge of the earth. These changes in turn have been correlated to changes in weather conditions, and thus are said to be useful in predicting weather changes.

The above-referenced patent is dealing with changes in the electrostatic field above the earth's surface. It has now been recognized that in addition to this above ground field, which is mostly negative, a lower, mostly positive field extends below the earth's conductive surface. This in turn has lead to the development of a meter for measuring the changes of this lower electrostatic field and to the recognition that such changes are useful in the predicting of earthquakes and other activity below the earth's surface.

SUMMARY OF THE INVENTION

The present invention provides a novel method for sensing the electrical charge of the earth's electrostatic field below the earth's surface and by repeated measurements sensing quantitatively changes in that charge level. To practice the method, a preferred apparatus consists of an inverted U-shaped tube preferably made of quartz or other dielectric material. One leg of the tube has an open lower end while the other end is connected to a closed fluid reservoir and is positioned below the end of the other leg of the tube. The tube and the reservoir contain mercury or other conductive fluid, and the diameter of the open ended leg of the tube is sufficiently small that the mercury will not flow from the tube so long as the other leg is in communication with the fluid reservoir. An electrically conductive coating is located on the exterior of the open ended leg of the tube. Preferably, this coating is provided by winding a wire coil around the exterior of that leg. The lower end of that coating is connected to one terminal of an electrometer, and a second terminal of the meter is connected to ground. A switch is positioned between the two terminals so that the conductive coating may be selectively connected to ground. A portion of the tubing adjacent the reservoir is electrically conductive, and that tube portion is electrically connected to ground. A piston controlled by a micrometer is movably mounted within the reservoir so that the level of the column of mercury in the tube can be precisely moved by the micrometer.

In accordance with the method of the invention, the level of mercury is first positioned within the area of the tube surrounded by the coating but spaced from the open end of the tube. The electrical coating is then grounded by closing the switch on the electrometer. The micrometer in the fluid reservoir is then moved in a direction that will move the mercury towards the end of the open end of the quartz tube a precise predetermined amount. The polarity selector as moved to negative; the conductive coating is then ungrounded; and the micrometer is operated to move the mercury away from the open end of the tube back to its initial position. This motion of the mercury will leave electrons on the inside of the tube, forming one plate of a capacitor. The tube is the dielectric of the capacitor and an equal positive charge is drawn to the outside of the tube from the conductive coating circuit. The electrometer will then show the corresponding negative amount. After recording the number and grounding the circuit, the apparatus is ready for the next reading. The numbers shown on the meter represents the negative charge in that part of the mercury column and will grow larger or smaller as the positive charge changes. When showing an earthquake the number grows smaller and smaller, showing a growing positive charge, until the earthquake occurs. The reduction in the readings between timed intervals provides an indication of the nearness of the earthquake, total reduction from the beginning provides information regarding the size of the earthquake.

If desired, the procedure may be modified to show a positive reading on the meter. In that situation, the conductive coating is grounded and the end of the mercury column is moved down toward the open end of the tube a short distance using the micrometer. The polarity selector is then moved to positive, the coating is ungrounded and the end of the mercury column is moved back away from the open end of the tube to its original position. The voltage shown on the meter in that instance is positive. Grounding the conductive coating readies the meter for the next reading.

Figure 1:
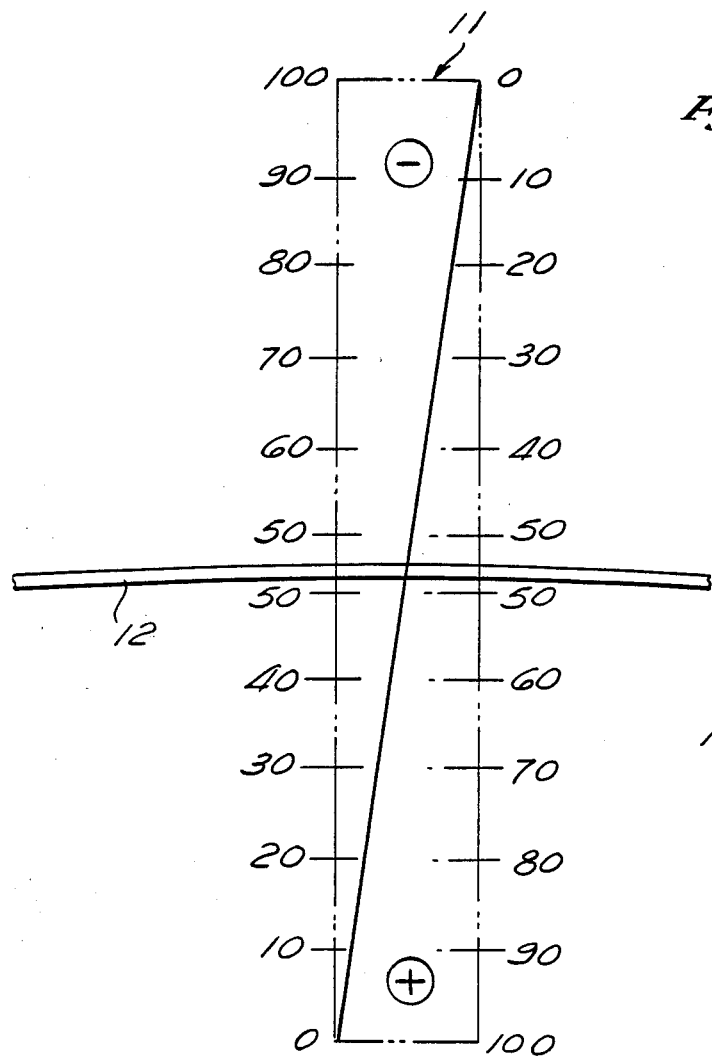
FIG. 1 is a schematic illustration of the electrical effect of the above ground and the below ground electrostatic fields of the earth.

The vertically oriented graph 11 or representation shown in FIG. 1 is to schematically illustrate the nature of the two strong electrostatic fields referred to above. The curved lines 12 are intended to represent the electrically conductive surface of the earth. It is believed that surrounding earth is an outer mostly negative electrostatic field which is primarily above the earth's surface. The strength of this field is schematically illustrated on the left side of the scale 11 wherein the negative field increases in strength as the distance from the earth's surface increases. There is some effect of this field beneath the earth's surface but this effect diminishes as the distance below the earth's surface increases.

Figure 2:
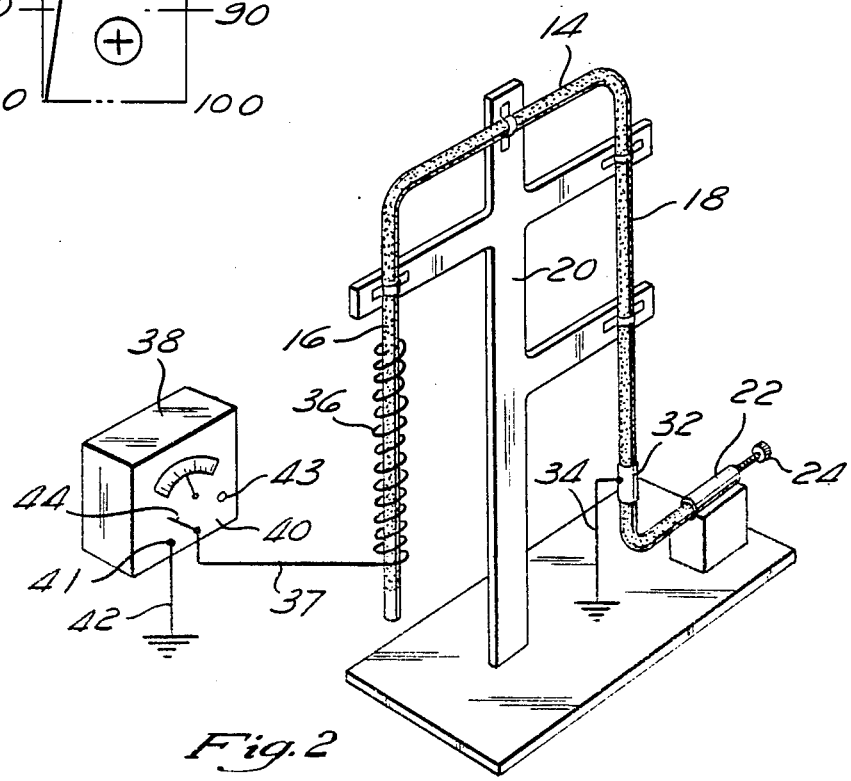
FIG. 2 is a perspective, schematic illustration of the apparatus of the invention.

The other electrostatic field is mostly positive, and primarily below the earth's conductive surface. This is illustrated on the right-hand side of the scale 11 wherein the strength of the field is seen increasing rapidly as the distance below the earth's surface increases. Conversely, the effect of that field above the earth's surface is schematically illustrated as diminishing rapidly as the distance above the earth's surface increases. The present invention is primarily concerned with this mostly positive electrostatic field below the earth's surface. Measurements of changes in that mostly positive electric field are measured at periodic intervals to provide an indication of subsurface activities such as earthquakes and volcanic eruptions. These measurements are made with the apparatus illustrated in FIG. 2.

The apparatus includes an inverted U-shaped tube 14 having a pair of vertically oriented legs 16 and 18, held by a suitable support 20. The tube leg 16 is open on its lower end 16a whereas the tube leg 18 is connected on its lower end to a reservoir or cylinder 22 containing mercury or other electrically conductive fluid. The mercury should be clean, dry and quite pure. The fluid can be forced into or withdrawn from the tube 14 by means of a piston (not shown) within the reservoir which is accurately moved by a micrometer 24. The inner diameter of the tube 14 is quite small, preferably, about 1 mm. Consequently, the mercury in the leg 16 of the U-shaped tube will not flow out its lower open end so long as the level of mercury in that leg is above the open end and so long as the other end of the tube is in sealed communication with the fluid reservoir. Thus, the level of mercury in the leg 16 may be precisely varied by operating the micrometer to inject or withdraw mercury from the tube. The fluid reservoir should be at least two inches below the open end of the tube leg 16 to prevent the mercury from siphoning out.

The tube is preferably made of fused quartz or some other suitable dielectric material. However, section 32 of the tube is made of electrically conductive material preferably iron, to minimize the risk of amalgamation, and is connected by a suitable conductor 34 to electrical ground. This electrical ground should be firmly connected to the earth's surface, such as by a long metal stake (not shown) embedded in the ground. Other suitable means may be employed for electrically connecting the mercury to ground.

An electrically conductive coating 36 is located on the exterior of the tube leg 16 in the area in which the mercury level is to be varied when measurements are being made. This electrically conductive coating is preferably provided by a fine copper wire wound tightly around the tube leg 16. The wire shown in the drawing is a schematic illustration of the finely wound copper wire which forms an electrically conductive coating. The lower end of the wire is connected by a conductor 37 to one input terminal 40 of an electrometer 38. The other terminal 41 of that meter is connected by a conductor 42 to an electrical ground. The two terminals are selectively connected or disconnected by the schematically illustrated switch arm 44.

An instrument that has been found satisfactory in experimental work is an electrometer identified as 610C by Keithley Instruments. Advantageously, the meter includes a polarity switch 43 that enables negative or positive voltages.

In a preferred way to make a reading of the earth's electrostatic field, the mercury in the tube leg 16 is moved, by the micrometer 24, a short distance below the middle of the tube while still within the area circumscribed by the conductive coating 36. The number on the micrometer 24 is recorded. The electrometer switch 44 is then closed to ground the electrically conductive coating 36 on the tube leg 16. The micrometer is then moved a predetermined amount, such as 0.005 inch in a direction that will move the mercury towards the open end of the tube leg 16. The switch 44 is opened to unground the conductive coating. The mercury is then moved 5 mm away from the open end of the tube leg 16 by suitably adjusting the micrometer. By this action, it is believed that the mercury will leave electrons on the inside of the tube, so that the electrons form one plate of a capacitor. The quartz tube 16 is the dielectric of such a capacitor, and an equal positive charge is believed to be drawn to the outside of the tube from the conductive coating circuit, and the electrometer will show the negative amount. The polarity switch button 43 is in its negative mode. This electrometer reading should be recorded. The switch is then closed to ground the coating and ready the instrument for the next reading.

The recorded number is believed to represent the negative charge in that part of the mercury column and will go larger or smaller as the positive charge of the earth's electrostatic field changes. Experimentation has shown that seismic events are related to these changes. When an earthquake is occurring the readings from the electrometer grow smaller and smaller, showing a growing positive charge, until the earthquake occurs. The readings then grow rapidly larger. The voltage change between timed intervals provides a clue to the nearness of the earthquake. Further, it is believed that the total change from the beginning of the changes provides an indication of the size of the earthquake.

Measuring the negative charge is convenient since the readings on the meter become smaller and smaller as the intensity of the positive charge of the earth's electrostatic field increases. This is consistent with the illustration in FIG. 1. However, as an alternative, the increase of the positive charge can be directly measured by moving the polarity switch 43 to its positive mode. With the conductive coating 36 grounded, the level of the mercury column is moved toward the open end 16a of the tube a short distance using the micrometer. The conductive coating 36 should then be ungrounded by opening the switch 42, and the level of the mercury column is moved away from the open end of the tube to its original position. This provides a positive voltage on the electrometer which can be read and recorded. Grounding the conductive coating then readies the meter for its next reading.

Long mercury columns provide a high voltage that may require special equipment other than a simple electrometer. Thus, it is easier to use the first method described to measure the reciprocal, low negative voltage in earthquake forecasting.

Figure 3:
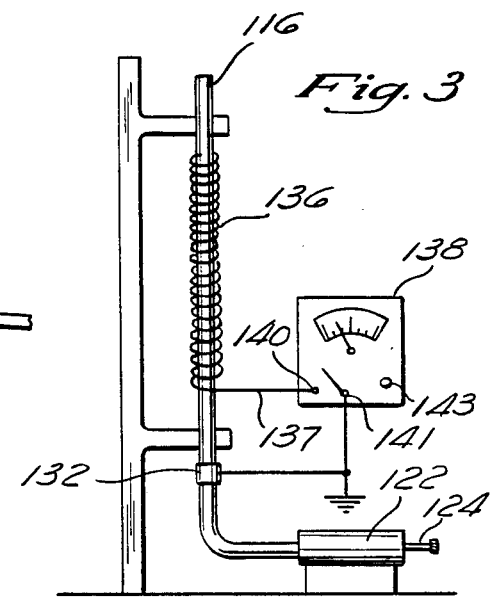
FIG. 3 is a perspective, schematic illustration of apparatus for measuring changes in the atmospheric electrostatic field.

With the apparatus of FIG. 3, changes in the earth atmospheric electrostatic field may be measured. A quartz tube 116, open on its upper end is connected on its lower end to a reservoir 122 containing mercury or other conductive fluid. A micrometer 124 controls the level of mercury in the tube 116. The mercury is grounded by means of conductive tube section 132 and a conductor 134 leading to ground. A fine conductive wire wound on the exterior of the tube 116 forms a coating 136 which is connected by a conductor 137 to one terminal 146 on an electrometer 138. The other terminal 141 is connected to ground. The terminals are connected or disconnected to each other by a switch 142. Positive or negative voltage can be measured by properly positioning a polarity switch 143.

In operation of the apparatus of FIG. 3, take a position near the middle of the quartz tube 118. Ground the conductive coating 136 by closing the switch 142, and move the end of the mercury column toward the open end of the tube 118 a distance measured by the micrometer. Now open the switch 142 to unground the conductive coating 136 with the polarity switch 142 on negative; move the end of the mercury column back to its original position; record the negative voltage shown on the meter 138; ground the coating to ready the apparatus for the next reading. The procedure for a positive reading is the same except the polarity switch 143 is set to positive.

What is claimed is:

1. Apparatus for measuring electric charge on a body such as the earth, independent of a reference comprising:
    a dielectric tube supported in a substantially vertical position;
    a reservoir containing a supply of conductive fluid, said tube having an inverted U-shape with the lower end of one leg of the tube being open and with the lower end of the other leg of said tube being connected to said reservoir, said reservoir being located below the level of the open ended leg of the tube, and the open ended leg of the tube having a relatively small diameter such that conductive fluid will now flow out the open end of the tube so long as the other end of the tube is sealed to the reservoir;
    a conductive coating located on a portion of the exterior of said tube at a location spaced from said reservoir;
    means associated with said reservoir for raising or lowering the level of said fluid in the area of said coating by introducing or withdrawing a precisely measured quantity of fluid to and from the reservoir;
    means for directly electrically connecting said fluid to said body;
    an electrometer having a terminal connected to said coating and a terminal connected to said body; and
    a switch for selectively short circuiting said terminals and connecting said coating to said body.

2. Apparatus of claim 1 wherein said means for electrically grounding said fluid is an electrically conductive section of said tube connected by a conductor to said body.

3. The apparatus of claim 1 wherein said coating comprises a small diameter electrically conductive wire wound tightly onto a section of said tube with the wire extending axially on the tube a substantial number of turns.

4. The apparatus of claim 1 wherein said means for raising and lowering the level of fluid comprises a micrometer for controlling a piston within said reservoir.

* * * * *

UNITED STATES PATENT AND TRADEMARK OFFICE
CERTIFICATE OF CORRECTION

PATENT NO. : 4,931,739

DATED : June 5, 1990

INVENTOR(S) : Arthur H. MacLaren

It is certified that error appears in the above-identified patent and that said Letters Patent is hereby corrected as shown below:

Column 6, line 6, change "fluid will now flow" to --fluid will not flow--.

Abstract, line 1, change "An apparatus for sensing" to --A method for sensing--.

Signed and Sealed this

Twenty-first Day of April, 1992

Attest:

HARRY F. MANBECK, JR.

*Attesting Officer*     *Commissioner of Patents and Trademarks*